US004001645B2

United States Statutory Invention Registration [19]

[11] Reg. Number: H1645

[45] Published: May 6, 1997

Lewis

[54] UNDERWATER MULTI-MODE NIGHT VISION APPARATUS

[76] Inventor: Michael L. Lewis, 318 Red Cedar La., Panama City, Fla. 32407

[21] Appl. No.: 368,836

[22] Filed: Jan. 3, 1995

[51] Int. Cl.[6] ..... H01L 31/00

[52] U.S. Cl. ..... 250/330; 359/895.

[58] Field of Search ..... 250/330; 359/895, 359/665

[56] References Cited

U.S. PATENT DOCUMENTS

| | | | |
|---|---|---|---|
| 3,787,688 | 1/1974 | Stone | 250/213 VT |
| 5,055,892 | 10/1991 | Gardner et al. | 257/99 |
| 5,331,459 | 7/1994 | Dor | 359/409 |

FOREIGN PATENT DOCUMENTS

| | | | |
|---|---|---|---|
| 2479488 | 10/1981 | France | 359/665 |

*Primary Examiner*—Bernarr E. Gregory

[57] ABSTRACT

An underwater night vision apparatus employing a night vision device for enhancing images illuminated solely by ambient light and an LED illuminator for provision of invisible infrared light to supplement ambient light. A catadioptric lens is used to increase optical efficiency and becomes the cover of a recessed compartment in the apparatus and in the optical path between the lens and the night vision device. The compartment fills with non-turbid seawater when the lens is changed underwater. The entrapped seawater constitutes a lens which contributes to the overall image enhancement.

9 Claims, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

UNDERWATER MULTI-MODE NIGHT VISION APPARATUS

INTRODUCTION

The present invention is an underwater night vision apparatus employing supplemental illumination. In particular, the present invention is an underwater night vision enhancement device employing invisible infrared illumination for no-light and low-light conditions in the marine environment.

BACKGROUND OF THE INVENTION

Military operations at night in undersea and surf line areas by divers and other undersea operatives is a source of continuing demand for operations support equipment. The need to clearly observe the underwater environment, potential and designated targets, and fellow divers and their well-being during operations is critical to mission success. In the past, there has been little or no night vision assistance for underwater swimmers engaged in clandestine activities. Previous devices were inefficient and easily detectable by surface observers. Counter-mine and counter-ship activities usually take place in very shallow water so surface detection is a very real and significant possibility.

SUMMARY OF THE INVENTION

It is thus an object of the present invention to provide enhanced underwater night visibility to swimmers and divers without permitting above-surface detection and observation.

It is yet an additional object of the present invention to provide enhanced nighttime visibility to underwater clandestine operatives where enhancement is invisible to above-surface observers.

It is still another object of the present invention to provide underwater image enhancement during nighttime subsurface swimming operations using invisible infrared illumination.

It is yet another object of the present invention to provide image enhancement in nighttime underwater operations using invisible infrared illumination in conjunction with night vision detection and catadioptric lens.

It is still another object of the present invention to provide nighttime image enhancement for underwater and surface clandestine operations with a single uncomplicated apparatus.

It is finally another object of the present invention to provide image enhancement in a nighttime subsurface and surface clandestine operation undetectable by unaided surface observers where the optics employed may be changed underwater to improve overall image enhancement and to amplify the image by the inclusion of any water containment by the invention during lens changes underwater.

The present invention is a night vision device for amplification of ambient light coupled with an invisible infrared illuminator and an interchangeable catadioptric lens system. The invention is capable of being used underwater, at and above the surface of the water and in the surf transition zone therebetween. The invention benefits from the inclusion of turbidity-free water entrapped between a lens and the night vision portion of the invention to which it is attached when lens changes are made underwater. The wide angle lens also acts as a light gathering element and enhances the overall effectiveness of the system.

The invention combines light intensification in the night vision portion with catadioptric lens and invisible infrared illumination in an easy-to-use package for clandestine nighttime underwater and surface special warfare operations undetectable by adversary observers without special detection equipment. The invention enhances and magnifies the underwater swimmer's vision in no-light and low-light conditions.

The underwater operative can use the present invention to see objects at a distance underwater and above the surface to observe, identify, catalog, and mark suspected troop locations, material stock piles, and underwater demolition devices such as mines without revealing his presence. He can also use the device with A 75 mm lens to observe the lasing of targets by friendly aircraft to ensure correct target identification.

These and other objects, benefits, and advantages of the present invention will be more fully understood when the following drawings are considered in conjunction with the detailed description of the invention herein.

DETAILED DESCRIPTION

Figure 1:
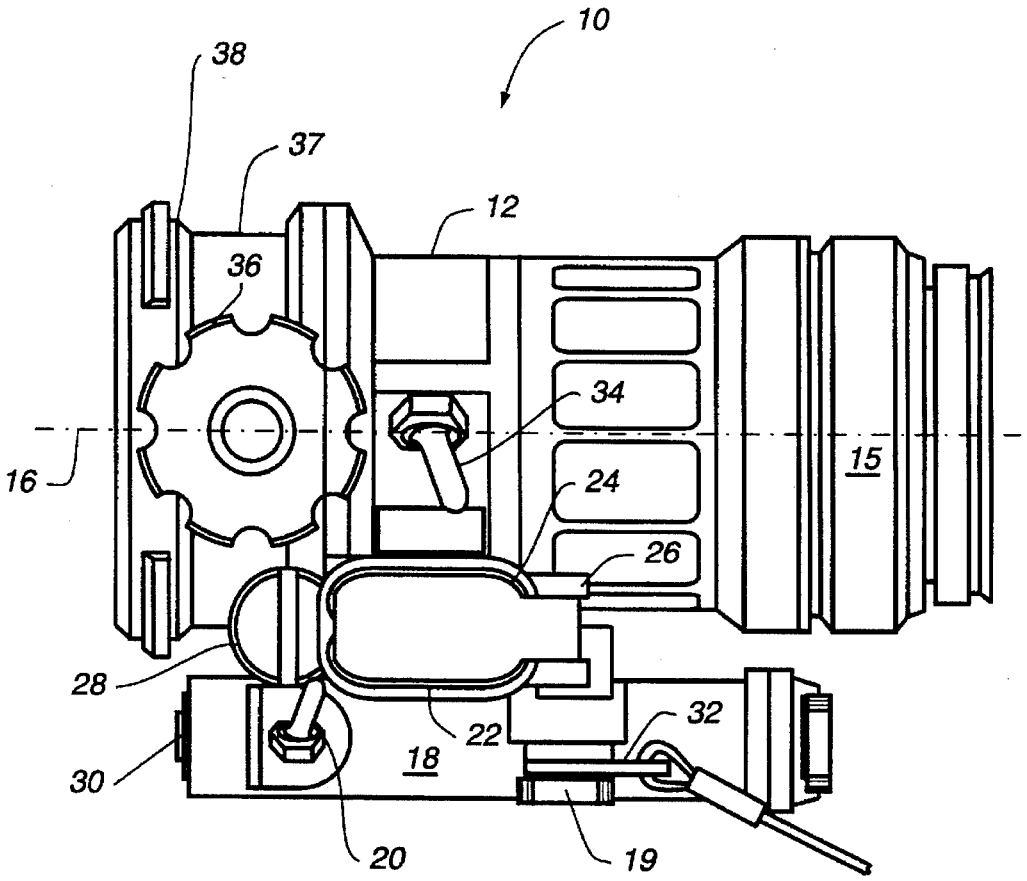
FIG. 1 is a side view of the subject invention without added lens.
Figure 2:
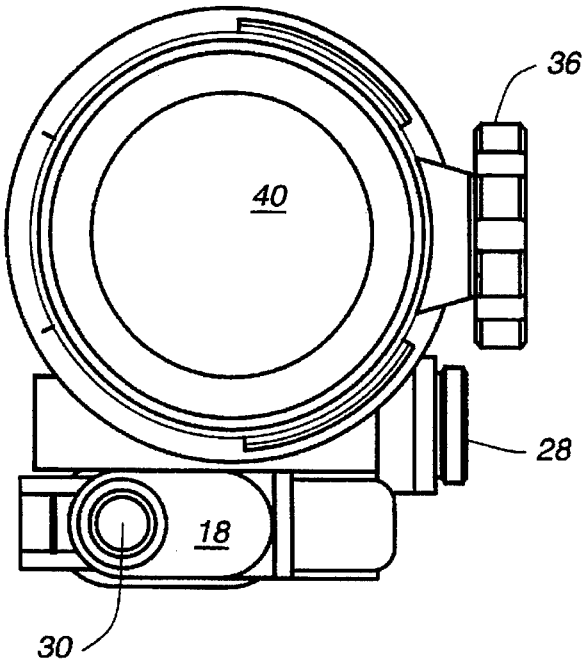
FIG. 2 is a front view of the invention depicted in FIG. 1.
Figure 3:
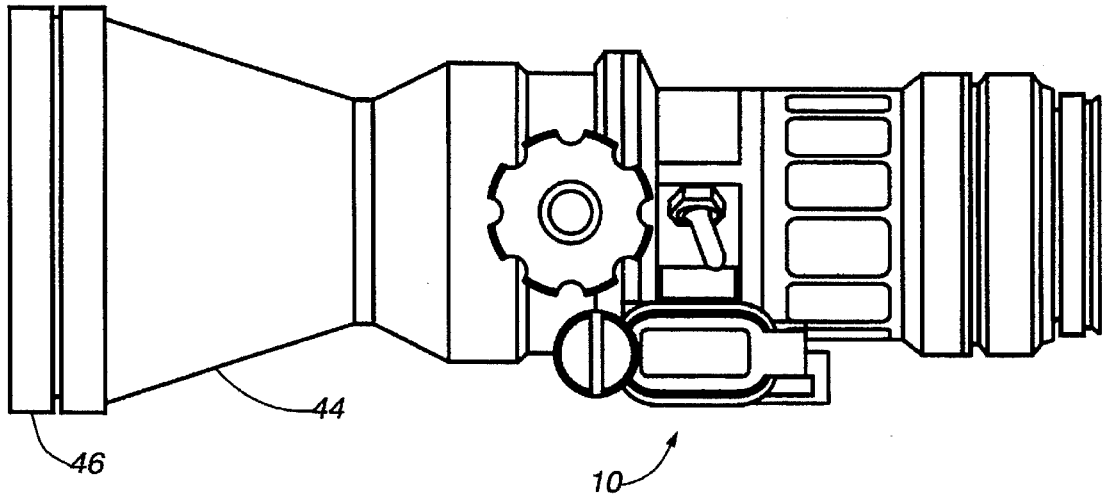
FIG. 3 is a side view of the invention with a 75 mm lens attached.

With reference to FIG. 1, the present invention, the underwater multi-mode night vision apparatus 10, is composed of the night vision device 12, the lens mounting ring 38, and the illuminator 18. The night vision device 12 is a cylinder-shaped body containing electronics known to those skilled in the art for multiplying extremely low levels of reflected natural ambient illumination, such as but not limited to, starlight, to levels that make the scene observed visible when without such device the scene would not be visible to the unaided human eye. The night vision device 12 has the eyepiece 14 at one end and the lens mounting ring 38 at the opposite end. The lens mounting ring 38 is connected to the movable focus tube 37 which is movable by virtue of its connection to the rotary focus knob 36. The rotary focus knob 36 moves in and out of the device 12 radially from and normal to its main axis 16. The rotary action of the knob 36 causes translational movement of the tube along the main axis 16 so that the 26 mm lens 40 mounted therein, as shown in FIG. 2, and any lens attached thereto such as the 75 mm lens 44 shown in FIG. 3, by way of the lens mounting ring 38 is caused to move accordingly. The eyepiece 14 is adjustable by way of its connection to the rotary collar 15 which moves back and forth along and normal to the main axis 16 of the device 12. Switch 34 is the ON/OFF switch for the device.

The illuminator 18 is shown in FIGS. 1 and 2 attached to the night vision device 12 with the mounting lug 19. The lanyard swivel lug 32 is located between the illuminator body and the mounting lug 19. The battery compartment 22 is an integral part of the illuminator 18. The battery compartment 22 has a cover 24 rotatably attached at the cover hinge 26. The cover 24 is secured to the compartment 22 by the cover release 28. A diode/lens assembly 30 is located at the forward end of the illuminator 18.

In a preferred embodiment of the present invention, the night vision device 12 is a model MK860UW ultra high resolution, waterproof pocketscope manufactured by Star-Tron Technology corporation of Pittsburgh, PA, USA. The system gain is about 2200, the field of view is 40° and the magnification is 1X. The device uses two AAA batteries as a power source to achieve an operating time of about 40 hours. An ultracapacitor can be used as an alternative power source. The objective lens of the device is about 26 mm. The night vision device 12 was a wafer-type having a gain of about 20000 with a photocathode sensitivity of 250 MA/LM (min.) and about 11 (min.) MA/W at 850 NM. The signal to noise ratio of the night vision device 12 is about 5.0 min. The device without attached lens is about 2 inches by 5 inches, with a weight of about 14 oz. The infrared emitting diode used in the illuminator 18 was a super high-power gallium-aluminum-arsenide (GaAlAs) infrared emitter, model OD-50L emitting at 880 nanometers non-coherent infrared radiant energy when forward biased. This particular diode is manufactured by Opto Diode Corp. of Newburg Park, CA, USA.

Two catadioptric lens 40 and 44 adapted for underwater attachment and use were 26 mm and 75 mm focal lengths, respectively. The 75 mm lens 44 is employed where the need for greater underwater vision capability exists or to permit shoreline observations while still offshore. The water trapped between the 75 mm lens 44 and the 26 mm lens 40 when the 75 mm lens is attached underwater, acts much in the same way as a lens by providing an increase in magnification as does the face plate on a diver's facemask. The magnification increase is about 25%. Since the combined lens including the entrapped water would not work in extremely turbid water and operations are normally performed to preserve the non-turbid conditions, the clarity of the water trapped between the lenses is representative of the typically non-turbid ambient water. Thus, the entrapped non-turbid water acts to provide additional image amplification and enhancement.

The 75 mm lens 44 when operated above the surface can be used to view and verify targets painted by Laser Target Designation Devices, such as aircraft utilize. The optics allow the viewer to observe the laser beam even though the beam is invisible to the unaided eye. This can prevent the destruction of an unauthorized or unintended target.

It should be obvious that various combinations of components can be substituted for those optical and electronic components identified above, depending upon specific dictates of operational applications without going beyond the bounds of the invention as claimed hereinafter.

| DICTIONARY | |
|---|---|
| 10 | Multi-mode (infrared) night vision appartus |
| 12 | Night vision device |
| 14 | Eyepiece |
| 15 | Rotary collar |
| 16 | Main axis |
| 18 | Illuminator |
| 19 | Mounting lug |
| 20 | Illuminator ON/OFF switch |
| 22 | Battery compartment |
| 24 | Battery compartment cover |
| 26 | Cover hinge |
| 28 | Compartment cover release screw |
| 30 | Diode/lens assembly |
| 32 | Lanyard swivel lug |
| 34 | NVD ON/OFF switch |
| 36 | Focus knob |
| 37 | Movable focus tube |
| 38 | Lens mounting ring |
| 40 | 26 mm lens |
| 44 | 75 mm lens |
| 46 | Filter ring |

What I now claim as my invention is:

1. A underwater infrared night vision apparatus comprising:

a means for intensifying ambient light and invisible infrared light in low and no-light environments, said means having a cylinder-like body having a lens mounting ring affixed to one end of a movable focusing tube encircling one end of said body, the opposite end of said body having an adjustable eyepiece;

a means for producing and emitting invisible infrared energy to supplement and enhance the illumination of a no-light and low-light environment, said means affixed to said intensifying means; and a catadioptric lens mounted to said mounting ring of said movable focusing tube.

2. The apparatus of claim 1 wherein said means for producing and emitting invisible infrared energy comprises:

a light emitting diode operating in the invisible infrared portion of the spectrum;

a storage type power source; and a circuit having an ON/OFF switch and connecting said power supply to said light emitting diode through said switch.

3. The apparatus of claim 2 wherein said light emitting diode is an Aluminum Gallium Arsenide diode operating at about 880 nanometers.

4. The apparatus of claim 2 wherein said power source is selected from the group consisting of a storage battery and an ultracapacitor.

5. The apparatus of claim 1 further comprising a recessed compartment extending from said lens mounting ring into said focusing tube for entrapping seawater when said catadioptric lens is mounted to said ring in the underwater environment.

6. An underwater infrared night vision apparatus comprising:

a night vision image intensifying device having a detection capability from ambient night light to invisible infrared and having a cylinder-like body having a lens mounting ring affixed to one end of a movable focusing tube encircling one end of said body, the opposite end of said body having an adjustable eyepiece;

a light emitting diode assembly containing a light emitting diode capable of emitting invisible infrared light, a storage type power source, and a circuit containing an ON/OFF switch connecting said diode to said power source, said diode assembly affixed to said image intensifying device, and a catadioptric lens mounted to said mounting ring of said movable focusing tube.

7. The apparatus of claim 6 wherein said light emitting diode is an Aluminum Gallium Arsenide diode operating at about 880 nanometers.

8. The apparatus of claim 7 further comprising a recessed compartment extending from said lens mounting ring into said focusing tube for entrapping seawater when said catadioptric lens is mounted to said ring in the underwater environment.

9. The apparatus of claim 6 wherein said power source is an ultracapacitor.

* * * * *